United States Patent [19]
Rochette et al.

[11] Patent Number: 5,293,153
[45] Date of Patent: * Mar. 8, 1994

[54] METHOD AND APPARATUS FOR TESTING AN AIRBAG RESTRAINT SYSTEM WITH PARALLEL SENSORS

[75] Inventors: Jeffrey R. Rochette, Livonia; Edward J. Abeska, Ferndale, both of Mich.

[73] Assignee: TRW, Inc., Lyndhurst, Ohio

[*] Notice: The portion of the term of this patent subsequent to Feb. 16, 2000 has been disclaimed.

[21] Appl. No.: 682,566

[22] Filed: Apr. 9, 1991

[51] Int. Cl.⁵ .............................................. B60Q 1/00
[52] U.S. Cl. ................................... 340/438; 280/735; 307/10.1
[58] Field of Search ............... 340/436, 438; 307/10.1; 280/734, 735

[56] References Cited

U.S. PATENT DOCUMENTS

| | | | |
|---|---|---|---|
| 3,668,627 | 6/1972 | Brainerd . | |
| 3,714,627 | 1/1973 | Dillman et al. | 340/436 X |
| 3,767,002 | 10/1973 | Gillund | 280/735 |
| 3,849,759 | 11/1974 | Hosaka et al. | 340/436 X |
| 3,909,777 | 9/1975 | Baba et al. | 340/436 X |
| 4,086,562 | 4/1978 | Hasegawa | 340/436 X |
| 4,366,465 | 12/1982 | Veneziano . | |
| 4,673,912 | 6/1987 | Kumasaka et al. . | |
| 4,825,148 | 4/1989 | McCurdy et al. | 324/64 |
| 4,835,513 | 5/1989 | McCurdy et al. | 340/438 |
| 4,851,705 | 7/1989 | Musser et al. . | |
| 4,987,316 | 10/1989 | White | 340/436 |
| 4,990,884 | 2/1991 | McCurdy et al. | 340/438 |
| 5,136,275 | 8/1992 | Madau et al. | 340/438 |
| 5,187,465 | 2/1993 | Stonerook et al. | 340/438 |

Primary Examiner—Brent Swarthout
Attorney, Agent, or Firm—Tarolli, Sundheim & Covell

[57] ABSTRACT

A method and apparatus are disclosed for testing an airbag restraint system of the type having at least two parallel connected inertia sensors connected in series with a squib across a source of electrical energy, each inertia sensor having a normally open switch and an associated parallel connected resistor. Each parallel connected inertia sensor has a series connected diode for isolating its associated inertia sensor circuit from other circuit components in the firing circuit. A microcontroller monitors at least one voltage value at a component connection while at least one parallel connected inertia sensor is isolated. The microcontroller determines a value functionally related to the resistance of at least one circuit component in the firing circuit while at least one parallel connected inertia sensor is isolated. The microcontroller compares the determined value against predetermined limits. If the determined value is not within the predetermined limits, an error indication is provided.

9 Claims, 1 Drawing Sheet

METHOD AND APPARATUS FOR TESTING AN AIRBAG RESTRAINT SYSTEM WITH PARALLEL SENSORS

TECHNICAL FIELD

The present invention relates to diagnostic testing of an airbag restraint system and is particularly directed to a method and apparatus for testing an airbag restraint system having parallel sensors.

BACKGROUND ART

Airbag-restraint systems for passenger vehicles are known. These systems typically include a firing circuit having a squib and at least two normally open inertia switches, all connected in series across a source of electrical energy. The two inertia switches are known in the art as the safing sensor and the front sensor. The safing sensor is located in the passenger compartment and the front sensor is located near the front of the vehicle. Upon closure of the two inertia switches, as occurs during a vehicle crash, electrical current of sufficient magnitude and duration passes through the squib so as to ignite the squib. The squib, when ignited, ignites a combustible gas generating composition or pierces a container of pressurized gas which results in inflation of the airbag.

If the firing circuit in an airbag restraint system is non-operative, the airbag would not be deployed upon the occurrence of a crash condition. Such non-operative conditions, for example, include (i) an open circuit in the series connection of the squib and the two inertia switches, or (ii) a short circuited squib. Also, a nonoperative condition exists if excessive impedance exists in connections between firing circuit components so that upon closure of the inertia switches, the squib does not draw enough current to fire the squib.

Diagnostic test circuits have been developed to monitor the operativeness of the firing circuit portion of the airbag restraint system. If a non-operative condition is detected in the firing circuit, the diagnostic circuits alert the vehicle operator by lighting a warning lamp. Such diagnostic test circuits are disclosed in U.S. Pat. No. 4,835,513 to McCurdy et al., U.S. Pat. No. 4,825,148 to McCurdy et al., and U.S. Pat. No. 4,990,884 to McCurdy et al., all assigned to the assignee of the present invention, and all of which are hereby fully incorporated herein by reference.

These known diagnostic circuits separately monitor certain parameters of various components in the firing circuit, including the two inertia switches, the squib, and the storage capacitor. The diagnostic circuits monitor for both short and open circuits in the firing circuit and perform tests to determine if resistance or capacitance values of firing circuit components are within predetermined limits. Upon detection of an unacceptable condition in the firing circuit, the circuit alerts the vehicle operator by lighting an indicator lamp located in the passenger compartment. Also, the diagnostic circuits in these patents provide for recording a detected out-of-tolerance condition in an electrically erasable programmable read only memory ("EEPROM") for later analysis by a service technician.

A vehicle may be subject to any one of many different types of crash conditions. For example, the vehicle can hit a barrier such as another vehicle. The vehicle may also crash into a pole. Therefore, it is desirable to have a plurality of crash sensors mounted at various locations of the vehicle so as to be able to sense different types of crash conditions. Such plurality of sensors would be electrically connected in parallel so that the airbag is deployed when any one of several types of crash conditions occurs. Even though certain parallel connections are present in the firing circuit, it is desirable to separately monitor the circuit elements of the firing circuit, as much a possible, for diagnostic testing purposes.

SUMMARY OF THE INVENTION

The present invention provides a new method and apparatus for testing an airbag restraint system for a passenger vehicle particularly of the type having operatively parallel connected components in the firing circuit. In accordance with the present invention, certain firing circuit components are electrically isolated from other firing circuit components while a known test current is passed through the isolated components. The voltages at component connection points are monitored and component values are determined.

Specifically, an apparatus is provided for testing an airbag restraint system of the type having a firing circuit with a series connection of several circuit components including at least one set of operatively parallel connected inertia sensors connected in series with a squib across a source of electrical energy. Each inertia sensor of the operatively parallel connected inertia sensors has a normally open switch. The operatively parallel connected inertia sensors each has an associated parallel connected resistor. The apparatus comprises means for isolating at least one of the operatively parallel connected inertia sensors from other circuit elements of the firing circuit. Means are provided for monitoring at least one voltage value at a component connection in said firing circuit while the at least one inertia sensor is isolated. The apparatus further comprises means for determining from the monitored voltage value a value functionally related to the impedance of at least one circuit component of said firing circuit while the at least one parallel connected inertia sensor is isolated. Means are provided for comparing the determined value against predetermined limits. The apparatus further includes means for providing an error indication if the determined value is not within the predetermined limits.

A method is provided in accordance with the present invention for testing an airbag restraint system of the type having a firing circuit with at least two parallel connected inertia sensors connected in series with a squib across a source of electrical energy, each inertia sensor having a normally open switch and an associated parallel connected resistor. The method comprises the steps of isolating at least one of the two operatively parallel connected inertia sensors from other circuit components of its associated firing circuit, monitoring at least one voltage value at a component connection while the at least one of the two operatively parallel connected inertia sensors is isolated, determining from the monitored voltage value a value functionally related to the impedance of at least one inertia sensor, comparing the determined value against predetermined limits, and providing an error indication if the determined value is not within the predetermined limits.

BRIEF DESCRIPTION OF THE DRAWINGS

Further features and advantages of the present invention will become apparent to those skilled in the art to which the present invention relates from reading the following detailed description with reference to the accompanying drawing, FIG. 1, which is a schematic illustration of an apparatus for testing an airbag restraint system made in accordance with the present invention.

DESCRIPTION OF PREFERRED EMBODIMENT

Figure 1:
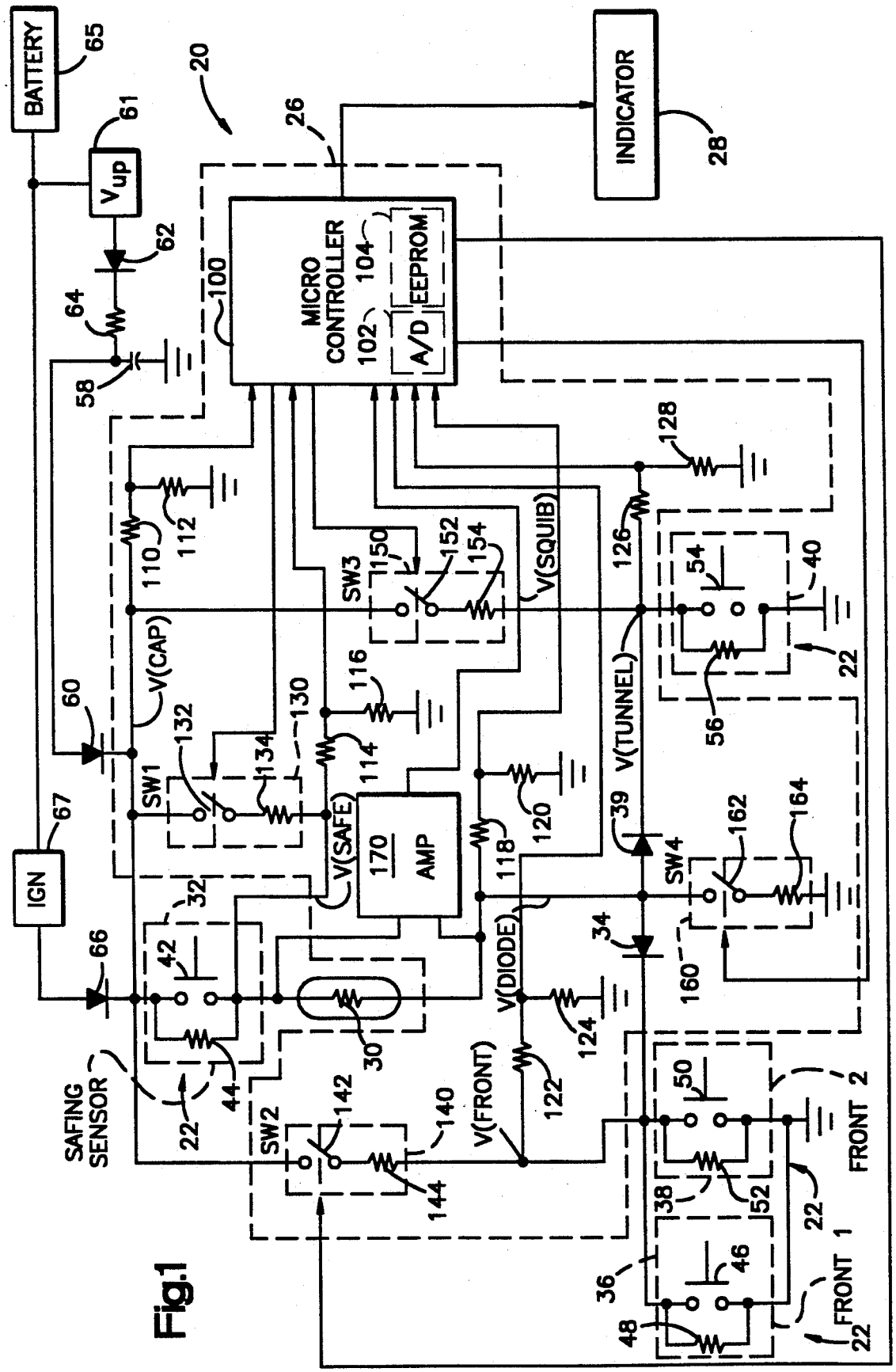

Referring to the drawing, an airbag restraint system 20, made in accordance with the present invention,, is shown. The airbag system 20 includes a firing circuit 22. A diagnostic circuit 26 monitors the operativeness of the firing circuit 22. An indicator 28, such as a light or buzzer, located in the passenger compartment of the vehicle, is energized by the diagnostic circuit 26 if an unacceptable condition is detected in the firing circuit 22.

The firing circuit 22 includes a squib 30 connected in a first series path of a safing inertia sensor 32, a diode 34, and parallel connected front inertia sensors 36, 38. The squib 30 is connected in a second series path of the safing inertia sensor 32, a diode 39, and a tunnel inertia sensor 40. The diode 34 with sensors 36, 38 are operatively connected in parallel with diode 39 and sensor 40.

The safing sensor 32 includes a normally open inertia switch 42 and a parallel connected resistor 44. The front sensor 36 includes a normally open inertia switch 46 and a parallel connected resistor 48. The front sensor 38 includes a normally open inertia switch 50 and a parallel connected resistor 52. The tunnel sensor 40 includes a normally open inertia switch 54 and a parallel connected resistor 56.

One terminal of the front sensors 36, 38 and the tunnel sensor 40 are connected to electrical ground. One terminal of the safing sensor 32 is connected to one terminal of a storage capacitor 58 through a diode 60. The other terminal of the storage capacitor 58 is connected to electrical ground. The capacitor 58 is connected to the output of a voltage upconverter 61 through a diode 62 and resistor 64. The voltage upconverter is connected to the vehicle's battery 65.

The junction between diode 60 and safing sensor 32 is connected to the vehicle battery through the vehicle's ignition switch 67 and diode 66. The vehicle battery functions as the primary energy source for the firing circuit 22. The storage capacitor 58 functions as a backup energy source should the battery connection be lost.

The safing sensor 32 is physically located as part of an assembly that houses the diagnostic circuit 26. This assembly preferably is located within the passenger compartment. The front sensors 36, 38 are preferably mounted neat the front of the vehicle under the left and right front wheel wells, respectively. The tunnel sensor 40 is located on a front-to-back center-line of the vehicle preferably on the transmission tunnel. These locations provide for sensing of different types of vehicle crashes and thereby permit a responsive deployment of the airbag. For example, if the vehicle were to collide straight ahead with a pole along the vehicle front to back center line, the two front sensors 36, 38 may not immediately close since the wheel wells are continuing to move as the fenders wrap around the pole. However, under such a crash condition, both the safing sensor 32 and the tunnel sensor 40 close immediately thereby deploying the airbag.

The resistors 44, 48, 52 and 56 in the firing circuit 22 permit a test current to flow through the firing circuit 22. The value of the resistors 44, 48, 52, 56 are selected so that the test current through the squib 30 is less than that required to fire the squib 30.

The diagnostic circuit 26 is connected to and monitors various circuit connection locations in the firing circuit 22. If the firing circuit determines that an unacceptable or out-of-tolerance condition exists in the firing circuit 22, it provides a warning to the vehicle operator via the indicator 28 and records the occurrence in an internal electronic memory.

Specifically, the diagnostic circuit 26 includes a microcontroller 100 of the type having an internal analog-to-digital ("A/D") converter 102 and an internal EEPROM 104. One such microcontroller is manufactured by Motorola Inc., under part No. MC68HC05B6. The junction between the diode 60 and the safing sensor 32 is connected to the A/D converter 102 of the microcontroller 100 through a resistor dividing network 110, 112. The voltage at the junction of the diode 60 and the safing sensor 32, referred to herein as V(CAP), is equal to the voltage across the capacitor 58 less the voltage drop across the diode 60.

The junction between the safing sensor 32 and the squib 30 is connected to the A/D converter 102 of the microcontroller 100 through a resistor dividing network 114, 116. The voltage at the junction between the safing sensor 32 and the squib 30 is referred to herein as V(SAFE).

The junction between the squib 30 and the anodes of diodes 34, 39 is connected to the A/D converter 102 of the microcontroller 100 through a resistor dividing network 118, 120. The voltage at the junction between the squib 30 and the diodes 34, 39 is referred to herein as V(DIODE). The junction between the diode 34 and the front sensors 36, 38 is connected to the A/D converter 102 of the microcontroller 100 through resistor dividing network 122, 124. The voltage at the junction between the diode 34 and the front sensors 36, 38 is referred to as V(FRONT). The junction between the diode 39 and the tunnel sensor 40 is connected to the A/D converter 102 of the microcontroller 100 through resistor dividing network 126, 128. The voltage at the junction between diode 39 and the tunnel sensor 40 is referred to as V(TUNNEL).

A first controllable switching circuit 130, referred to herein as SW1, has one terminal connected to the junction of the safing sensor 32 and the diode 60 and a second terminal connected to the junction of the safing sensor 32 and squib 30. The switch SW1 includes an electrically controllable, normally open switch 132 operatively connected to an output of the microcontroller 100. A resistor 134, having a known resistance value, is connected in series with the switch 132. When the microcontroller 100 closes the switch 132, the junction between the safing sensor 32 and diode 60 is connected to the junction between the safing sensor 32 and the squib 30 through resistor 134.

A second controllable switch 140, referred to herein as SW2, has one terminal connected to the junction of diode 60 and the safing sensor 32 and a second terminal connected to the junction of diode 34 and the front sensors 36, 38. The switch SW2 includes an electrically controllable, normally open switch 142 operatively connected to an output of the microcontroller 100. A resistor 144, having a known resistance value, is connected in series with the switch 142. When the microcontroller 100 closes switch 142, the junction of diode 60 and inertia switch 32 is connected to the junction of diode 34 and the front sensors 36, 38 through resistor 144.

A third controllable switch 150, referred to herein as SW3, has one terminal connected to the junction of diode 60 and the safing sensor 32 and a second terminal connected to the junction of diode 39 and the tunnel sensor 40. The switch SW3 includes an electrically controllable, normally open switch 152 operatively connected to an output of the microcontroller 100. A resistor 154, having a known resistance value, is connected in series with switch 152. When switch 152 is closed by microcontroller 100, the junction of diode 60 and the safing sensor 32 is connected to the junction of diode 39 and the tunnel sensor 40 through resistor 154.

A fourth controllable switch 160, referred to herein as SW4, has one terminal connected to the junction of diodes 34, 39 and a second terminal connected to electrical ground. The switch SW4 includes an electrically controllable, normally open switch 162 operatively connected to an output of the microcontroller 100. A resistor 164, having a known resistance value, is connected in series with switch 162. When switch 162 is closed by the microcontroller 100, the junction of diodes 34, 39 is connected to electrical ground through resistor 164.

Resistors 144, 154 and 164 are selected to have resistance values significantly lower than the resistances of sensor resistors 44, 56 and the parallel combination of 48, 52. Then, when switches SW2, SW3, and SW4 are closed, the voltage at the anodes of diodes 34, 39 is less than the voltage at the cathode of diodes 34, 39 whereby diodes 34, 39 are reverse-biased.

A differential amplifier circuit 170 is operatively connected across the squib 30. The amplifier 170 outputs a voltage signal, designated as V(SQUIB), to the A/D converter 102 of the microcontroller 100. The output of amplifier 170 is a voltage value functionally related to the voltage drop across the squib 30. The voltage drop across the squib 30 is functionally related to the resistance value of the squib 30.

With the diagnostic circuitry 26 as described, the microcontroller 100, using switches SW1–SW4, evaluates the operativeness of the firing circuit 22 by determining the values of certain parameters of the circuit components in the firing circuit 22 and comparing the determined values against predetermined limits. The present invention is directed to the determination of component values in the firing circuit 22 by isolating certain firing circuit components from the remainder of the firing circuitry. This is accomplished by reverse-biasing diodes 34, 39 and thereby isolating electrical components on the cathode side of the diodes 34, 39 from the electrical components on the anode side of the diodes 34, 39.

U.S. Pat. No. 4,990,884 assigned to the assignee of the present invention, is hereby incorporated herein by reference. The '884 patent describes, in detail, a method of measurement of certain firing circuit component parameters in an airbag restraint system. The tested component parameters include the capacity of the storage capacitor and the impedance of the squib. These methods are mentioned here since it is contemplated that they would be incorporated into the airbag testing system described herein. Also, U.S. patent application Ser. No. 589,456, filed Sep. 27, 1990 in the name of Stonerook et al., and assigned to the assignee of the present application, is incorporated herein by reference. The '456 application describes one embodiment of electrically controllable switches that can be used for switches 130, 140, 150, and 160 of the present invention. In a preferred embodiment, switches 130, 140, 150, 160 are solid state switches using bipolar junction transistors. Also, details of the amplifier circuit 170 are described in the '456 application. The present invention, however, is not limited to any specific type of electrically controlled switch nor a specific amplifier configuration.

The determination of the component values of the firing circuit elements, such as resistance value, requires the solution of appropriate algorithms based upon known principles and laws of electrical and electronic engineering.

Monitor Tests

The microcomputer first conducts "monitor tests." The purpose of the monitor tests are to make gross measurements to determine (i) if the squib is open circuited, and (ii) if the front sensors, safing sensor, or the tunnel sensor are shorted. To determine if the squib is open circuited, the output V(SQUIB) is monitored with all switches open and again when switches SW1 and SW4 are closed. The two measured values are compared against associated limits. If the measured values are less than their associated predetermined limits, the squib 30 is considered open circuited. If the squib is open, such failure is recorded in memory 104 and the indicator 28 is energized. The monitor test for the front sensors and the tunnel sensor is accomplished by measuring V(DIODE) with switches SW1 and SW4 closed. If the measured value is less than a predetermined limit, the front sensors and/or the tunnel sensor are considered shorted. Such failure is recorded in memory 104 and the indicator 28 is energized. The monitor test for the diodes 34, 39 is accomplished by measuring V(FRONT), V(DIODE), and V(TUNNEL) with switches SW2, SW3, SW4 closed. if $$V(FRONT) - V(DIODE)$$

is less than a predetermined limit, diode 34 cannot be reversed biased due to a shorted sensor. If $$V(TUNNEL) - V(DIODE)$$

is less than a predetermined limit, diode 39 cannot be reversed biased due to a shorted sensor. If both diodes are not reversed biased, then the safing sensor is short circuited. If diode 34 is not reversed biased and diode 39 is, the front sensors are short circuited. If diode 39 is not reversed biased and diode 34 is, the tunnel sensor is short circuited.

The microcontroller next tests the resistance values of the inertia sensors 32, 36, 38, 40 to verify that the sensors are properly connected and that resistance due to sensor connections is not greater than a predetermined value.

Safing Sensor Resistance Tests

To test the resistance of the safing sensor, switches SW2, SW3 and SW4 are closed. Since the resistance values of resistors 144, 154, and 164 are lower than the values of resistors 44, 48, 52 and 56, diodes 34, 39 will be reverse biased and the test current path will be through (i) the safing sensor 32 and the resistor 164 only, (ii) the front sensors 36, 38 and the resistor 144, and (iii) the tunnel sensor 40 and resistor 154. The back biasing of the diodes 34, 39 effectively isolates the front sensors 36, 38 and the tunnel sensor 40 from each other and from the safing sensor 32. With SW2, SW3 and SW4 closed, measurements are made of V(CAP) and V(DIODE). The resistance value of the safing sensor is determined in accordance with the following equation:

$$\frac{K1 \times V(CAP)}{V(DIODE)} \text{ (with } SW2, SW3, SW4 \text{ closed)} \quad (1)$$

Where K1 is a constant having a value functionally related to the value of the resistor 164.

The microcontroller then determines whether the result of equation (1) is within a range or "window" of acceptable values. To be within the window, the result must be greater than a predetermined lower threshold and less than a predetermined upper threshold. If the result is not within the limits, the indicator light 28 is energized and the error is recorded in the EEPROM 104.

Front Sensor Resistance Test and Tunnel Sensor Resistance Test

The next test performed by the microcontroller 100 is to determine the resistance of the front sensors 36, 38 and the resistance of the tunnel sensor 40. To perform this test, measurements are made of V(CAP), V(TUNNEL), and V(FRONT) with SW2, SW3, SW4 closed. With SW2, SW3, and SW4 closed, diodes 34, 39 are reversed biased. This isolates the front sensors 36, 38 and the tunnel sensor 40 from each other and from the safing sensors. The following algorithms are solved:

$$R(FRONT) = \frac{K2 \times V(FRONT)}{V(CAP) - V(FRONT)} \quad (2)$$

$$R(TUNNEL) = \frac{K3 \times V(TUNNEL)}{V(CAP) - V(TUNNEL)} \quad (3)$$

Where K2 is a constant having a value functionally related to the chosen value of resistor 144 and K3 is a constant having a value functionally related to the chosen value of resistor 154.

The microcontroller 100 then determines whether the value determined by equation (2) is less than an associated lower threshold, within an associated window, or greater than an associated upper threshold. If less than the lower threshold, it is assumed than one or both of the front sensors 36, 38 is short circuited. If within the window, it is assumed that one of the front sensors 36, 38 is open circuited. If greater than the upper threshold, it is assumed that both of the front sensors 36, 38 are open circuited. If any of these conditions exists, the indicator 28 is energized and the error is recorded in the EEPROM 104. If the value is greater than the lower threshold and less than the associated window, the resistance is presumed to be proper.

The microcontroller 100 determines if the value determined by equation (3) is less than a lower threshold, or greater than an upper threshold. If less than the lower threshold, it is assumed sensor 40 is short circuited. If greater than the upper threshold, it is assumed sensor 40 is open circuited. If any of these conditions exists, the indicator 28 is energized and the error recorded in the EEPROM 104.

Squib Resistance Test

The next test performed by the microcontroller is a determination of the resistance of the squib 30. To perform this test, measurements are made of V(SQUIB) with no switches closed and then again with SW1 and SW4 closed, and V(CAP) with SW1 and SW4 closed. The microcontroller 100 then calculates a value in accordance with the following algorithm:

$$R(SQUIB) = \quad (4)$$

$$\frac{K4 \times (V(SQUIB) - V(SQUIB) \text{ with } SW1, SW4 \text{ closed})}{V(CAP) \text{ with } SW1, SW4 \text{ CLOSED}}$$

The microcontroller 100 then determines whether the value determined in equation (4) is within a predetermined window. If not within the window, the indicator 28 is energized and the error is recorded in the EEPROM 104.

Diode Test

The next test performed by the microcontroller is to determine whether the diode 34 is open circuited. To perform this test, all switches SW1-SW4 are open, which forward biases diode 34, and measurements of V(FRONT) and V(DIODE) are made. A value is then calculated in accordance with the following algorithm:

$$V(DIODE) - V(FRONT) \quad (5)$$

The microcontroller then determines whether the result of equation (5) is greater than a predetermined threshold. If the result is greater than the predetermined limit, the microcontroller concludes that diode 34 is open circuited, whereupon the indicator light 28 is energized and the error is recorded in the EEPROM 104.

The next test performed by the microcontroller is to determine whether the diode 39 is open circuited. To perform this test, the switches SW1-SW4 are open, which forward biases diode 39, and measurements of V(TUNNEL) and V(DIODE) are made. A value is then calculated in accordance with the following algorithm:

$$V(DIODE) - V(TUNNEL) \quad (6)$$

The microcontroller then determines whether the result of equation (6) is greater than a predetermined threshold. If the result is greater than the predetermined threshold, the microcontroller concludes that diode 39 is open circuited, whereupon the indicator light 28 is energized and the error is recorded in the EEPROM 104.

It should be appreciated that the present invention has provided a method and apparatus for isolating certain circuit components in the firing circuits of an airbag system having a plurality of parallel sensors for individual testing purposes. The method and apparatus of the present invention does not, however, disable the firing circuit at any time during the testing process. Although the diodes 34 and 39 are back biased during certain tests, closure of the inertia sensors due to a crash condition shorts out the electrically controlled test switches thereby permitting the normal current firing path through the safing sensor, the front sensor, and the squib.

From the above description of a preferred embodiment of the invention, those skilled in the art will perceive improvements, changes and modifications. Such improvements, changes and modifications within the skill of the art are intended to be covered by the appended claims.

Having described a preferred embodiment of the invention, the following is claimed:

1. An apparatus for testing an airbag restraint system of the type having a firing circuit including at least two parallel connected inertia sensors connected in series with a squib across a source of electrical energy, each of said at least two parallel connected inertia sensors having a normally open switch and an associated parallel connected resistor, said apparatus comprising:

means for isolating at least one of the parallel connected inertia sensors of the firing circuit from the other inertia sensor of the firing circuit;

means for monitoring, in said firing circuit, at least one voltage value at a component connection while said at least one of the parallel connected inertia sensors is isolated;

means for determining from the monitored voltage value a value functionally related to the resistance of at least one circuit component of said firing circuit while said at least one of the parallel connected inertia sensors is isolated;

means for comparing the determined value against a predetermined limit; and means for providing an error indication in response to said means for comparing.

2. The apparatus of claim 1 wherein said means for isolating includes diodes, each one of said two parallel connected inertia sensors having one of said diodes connected in series therewith so that said one of said two parallel connected inertia sensors is connected to the cathode side of said one of said diodes, the anode of each of said one of said diodes being connected to one terminal of the squib, said means for isolating further including a plurality of switching circuits, each of said one of said diodes having an associated switching circuit, each said associated switching circuit including a normally open switch, for, when closed, reverse biasing said one of said diodes.

3. The apparatus of claim 2 wherein said switching circuits include a first switching circuit connected between a source of electrical energy and the cathode of one of said diodes and a second switching circuit connected to the anode of said one of said diodes and to electrical ground for, when said first and second switching circuits are actuated, reverse biasing said one of said diodes and establishing a known test current through the parallel connected resistor associated with said one of said inertia sensors whose associated diode is reversed biased.

4. The apparatus of claim 3 wherein said means for monitoring includes means to monitor the voltage at the associated cathode of said one of said diodes and wherein said means for determining determines a value functionally related to the value of the parallel connected resistor associated with said one of said inertia sensors associated with the monitored cathode of the reversed biased diode.

5. The apparatus of claim 3 wherein said airbag restrain system includes a series connected inertia sensor having a normally open switch and a parallel connected resistor and wherein said switching circuits further include a third switching circuit connected between the source of electrical energy and the cathode of another of said one of said diodes, closure of said three switching circuits isolating said series connected inertia sensor from said parallel connected inertia sensors.

6. The apparatus of claim 3 wherein said first switching circuit includes a series connected sensing resistor of known value.

7. The apparatus of claim 5 wherein said second and third switching circuits each includes an associated series connected sensing resistor of known value.

8. An apparatus for testing an airbag restraint system of the type having a firing circuit including a safing inertia sensor having a normally open safing inertia switch and a safing resistor connected in parallel with the safing inertia switch, one terminal f the safing inertia switch connected to a source of electrical energy, a second terminal of said safing inertia switch connected to a first terminal of a squib, a first diode and a second diode each having their anode connected to a second terminal of said squib, the cathode of the first diode connected to a first parallel inertia sensor having a first normally open parallel inertia switch and a resistor connected in parallel with the first parallel inertia switch, the second terminal of said first parallel inertia switch being connected to electrical ground, a second parallel inertia sensor having a second normally open parallel inertia switch and a resistor connected in parallel with the second parallel inertia switch, one terminal of said second parallel inertia switch connected to the cathode of said second diode, the second terminal of said second parallel inertia switch being connected to electrical ground, said apparatus comprising:

a first switching network connected between said source of electrical energy and the cathode of the first diode, said first switching network including a first actuatable solid state switch connected in series with a first test resistor having a known resistance value;

a second switching network connected between the source of electrical energy and the cathode of the second diode, said second switch network including a second actuatable solid state switch connected in series with a second test resistor having a known resistance value;

a third switching network connected between the anodes of the first and second diodes and electrical ground, said third switching network including a third actuatable solid state switch connected in series with a third test resistor having a known resistance value;

means for controlling said first, second, and third solid state switches so as to selectively reverse bias said first and second diodes, and establish known test currents selectively though said parallel connected resistors of said safing sensor and the parallel connected resistors of the first and second parallel inertia sensors;

means for monitoring the voltage values of the source of electrical energy and the voltage value present at selected circuit junctions;

means for determining the resistance values of selected sensors based upon said monitored voltage values; and means to warn the vehicle operator if the determined resistance values are not within predetermined limits.

9. A method for testing an airbag restraint system of the type having a firing circuit including at least two parallel connected inertia sensors connected in series with a squib across a source of electrical energy, each of said parallel connected inertia sensors having a normally open switch and an associated parallel connected resistor, said method comprising the steps of:

isolating at least one of the parallel connected inertia sensors of the firing circuit from the other circuit components of the firing circuit;

monitoring at least one voltage value at a component connection while said at least one of the parallel connected inertia sensors is isolated;

determining from the monitored voltage value a value functionally related to the resistance of said at least one parallel connected inertia sensor;

comparing the determined value against predetermined limits; and providing an error indication if the determined value is not within the predetermined limits.

* * * * *

UNITED STATES PATENT AND TRADEMARK OFFICE
CERTIFICATE OF CORRECTION

PATENT NO. : 5,293,153

DATED : March 8, 1994

INVENTOR(S) : Jeffrey R. Rochette and Edward J. Abeska

It is certified that error appears in the above-identified patent and that said Letters Patent is hereby corrected as shown below:

Column 9, lines 60-61, change "restrain" to --restraint--.

Column 10, line 11, change "f" to --of--.

Column 12, line 1, after "said" insert --isolated--.

Signed and Sealed this

Fourth Day of October, 1994

Attest:

Attesting Officer

BRUCE LEHMAN

Commissioner of Patents and Trademarks

UNITED STATES PATENT AND TRADEMARK OFFICE
CERTIFICATE OF CORRECTION

PATENT NO. : 5,293,153
DATED : March 8, 1994
INVENTOR(S) : Jeffrey R. Rochette and Edward J. Abeska It is certified that error appears in the above-indentified patent and that said Letters Patent is hereby corrected as shown below:

Cover page, under "(*) Notice:" section, change "Feb. 16, 2000" to --Sep. 27, 2010--.

Signed and Sealed this

Fourth Day of April, 1995

Attest:

BRUCE LEHMAN

*Attesting Officer*          Commissioner of Patents and Trademarks